US009354510B2

(12) United States Patent
Yu et al.

(10) Patent No.: US 9,354,510 B2
(45) Date of Patent: May 31, 2016

(54) EUV MASK AND METHOD FOR FORMING THE SAME

(71) Applicant: Taiwan Semiconductor Manufacturing Company, Ltd., Hsin-Chu (TW)

(72) Inventors: Ching-Fang Yu, Hsinchu (TW); Ting-Hao Hsu, Hsinchu (TW); Sheng-Chi Chin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 245 days.

(21) Appl. No.: 14/245,642

(22) Filed: Apr. 4, 2014

(65) Prior Publication Data

US 2014/0205938 A1    Jul. 24, 2014

Related U.S. Application Data

(63) Continuation of application No. 13/328,166, filed on Dec. 16, 2011, now Pat. No. 8,691,476.

(51) Int. Cl.
*G03F 1/24* (2012.01)
*G03F 1/46* (2012.01)
*G03F 1/54* (2012.01)
*G03F 1/58* (2012.01)
*B82Y 10/00* (2011.01)
*B82Y 40/00* (2011.01)

(52) U.S. Cl.
CPC . *G03F 1/46* (2013.01); *B82Y 10/00* (2013.01); *B82Y 40/00* (2013.01); *G03F 1/24* (2013.01); *G03F 1/54* (2013.01); *G03F 1/58* (2013.01)

(58) Field of Classification Search
CPC .................................... G03F 1/24; G03F 1/22
See application file for complete search history.

(56) References Cited

U.S. PATENT DOCUMENTS

| 796,159 A | 8/1905 | Smolik |
| 5,049,901 A | 9/1991 | Gelbart |
| 5,182,056 A | 1/1993 | Spence et al. |
| 5,184,307 A | 2/1993 | Hull et al. |
| 5,247,180 A | 9/1993 | Mitcham et al. |
| 5,650,260 A | 7/1997 | Onishi |
| 5,980,913 A | 11/1999 | Penney |

(Continued)

FOREIGN PATENT DOCUMENTS

| CN | 1053843 A | 8/1991 |
| DE | 09319405 | 3/1994 |

(Continued)

OTHER PUBLICATIONS

English Translation of Chinese First Office Action for Chinese Application No. 200980141293.2 dated Feb. 4, 2013 (19 pages).

(Continued)

*Primary Examiner* — Stephen Rosasco
(74) *Attorney, Agent, or Firm* — Haynes and Boone, LLP

(57) ABSTRACT

An extreme ultraviolet (EUV) mask can be used in lithography, such as is used in the fabrication of a semiconductor wafer. The EUV mask includes a low thermal expansion material (LTEM) substrate and a reflective multilayer (ML) disposed thereon. A capping layer is disposed on the reflective ML and a patterned absorption layer disposed on the capping layer. The pattern includes an antireflection (ARC) type pattern.

20 Claims, 5 Drawing Sheets

(56) References Cited

U.S. PATENT DOCUMENTS

| | | | |
|---|---|---|---|
| 6,048,467 | A | 4/2000 | Dahmen et al. |
| 6,051,179 | A | 4/2000 | Hagenau |
| 6,369,814 | B1 | 4/2002 | Dorbie |
| 6,391,245 | B1 | 5/2002 | Smith |
| 6,500,378 | B1 | 12/2002 | Smith |
| 6,544,698 | B1 | 4/2003 | Fries |
| 6,665,048 | B2 | 12/2003 | Gelbart |
| 6,855,482 | B2 | 2/2005 | Mclean et al. |
| 6,942,830 | B2 | 9/2005 | Mulhaupt et al. |
| 6,995,830 | B2 | 2/2006 | De Jager |
| 6,998,219 | B2 | 2/2006 | Fries |
| 7,052,263 | B2 | 5/2006 | John et al. |
| 7,088,432 | B2 | 8/2006 | Zhang |
| 7,162,323 | B2 | 1/2007 | Brumback et al. |
| 7,195,472 | B2 | 3/2007 | John et al. |
| 7,358,283 | B2 | 4/2008 | Xu |
| 7,362,355 | B1 | 4/2008 | Yang et al. |
| 7,573,561 | B2 | 8/2009 | Fries |
| 7,636,610 | B2 | 12/2009 | Schillen et al. |
| 7,771,895 | B2 * | 8/2010 | Wu ........................ B82Y 10/00 430/394 |
| 2002/0155189 | A1 | 10/2002 | John |
| 2003/0074096 | A1 | 4/2003 | Das et al. |
| 2004/0075882 | A1 | 4/2004 | Meisburger |
| 2005/0032710 | A1 | 2/2005 | Fujinaka et al. |
| 2005/0056791 | A1 | 3/2005 | Donaghue et al. |
| 2005/0248062 | A1 | 11/2005 | Shkolnik et al. |
| 2005/0259785 | A1 | 11/2005 | Zhang |
| 2005/0288813 | A1 | 12/2005 | Yang et al. |
| 2006/0239588 | A1 | 10/2006 | Hull et al. |
| 2006/0249884 | A1 | 11/2006 | Partanen et al. |
| 2007/0179656 | A1 | 8/2007 | Eshed et al. |
| 2007/0259066 | A1 | 11/2007 | Sperry et al. |
| 2007/0260349 | A1 | 11/2007 | John et al. |
| 2008/0021586 | A1 | 1/2008 | Schillen et al. |
| 2008/0038396 | A1 | 2/2008 | John et al. |
| 2008/0054531 | A1 | 3/2008 | Keekes et al. |
| 2008/0113293 | A1 | 5/2008 | Shkolnik et al. |
| 2008/0169586 | A1 | 7/2008 | Hull et al. |
| 2008/0169589 | A1 | 7/2008 | Sperry et al. |
| 2008/0170122 | A1 | 7/2008 | Hongo et al. |
| 2008/0179785 | A1 | 7/2008 | Hammond et al. |
| 2008/0179787 | A1 | 7/2008 | Sperry et al. |
| 2008/0181977 | A1 | 7/2008 | Sperry et al. |
| 2008/0206383 | A1 | 8/2008 | Hull et al. |
| 2008/0217818 | A1 | 9/2008 | Holmboe et al. |
| 2008/0226346 | A1 | 9/2008 | Hull et al. |
| 2009/0133800 | A1 | 5/2009 | Morohoshi et al. |
| 2009/0146344 | A1 | 6/2009 | El-Siblani |
| 2009/0191489 | A1 | 7/2009 | Sandstrom |
| 2010/0125356 | A1 | 5/2010 | Shkolnik et al. |
| 2010/0249979 | A1 | 9/2010 | John et al. |
| 2013/0157177 | A1 | 6/2013 | Yu et al. |

FOREIGN PATENT DOCUMENTS

| | | |
|---|---|---|
| DE | 29911122 | 1/2001 |
| DE | 19929199 | 6/2001 |
| DE | 69909136 | 5/2004 |
| DE | 102006019963 | 10/2007 |
| EP | 0676275 | 10/1995 |
| EP | 1156922 | 11/2001 |
| EP | 1250997 | 4/2002 |
| EP | 1270185 | 1/2003 |
| EP | 1192041 | 3/2003 |
| EP | 1849587 | 10/2007 |
| EP | 1946908 A2 | 7/2008 |
| FR | 2692053 | 12/1993 |
| WO | 9515841 | 6/1995 |
| WO | 9600422 | 1/1996 |
| WO | 9841944 | 9/1998 |
| WO | 0140866 | 6/2001 |
| WO | 0133511 | 10/2001 |
| WO | 03059184 | 7/2003 |
| WO | 2005110722 | 11/2005 |

OTHER PUBLICATIONS

English Translation of Japanese First Office Action for Japanese Application No. 2011-532311 dated Feb. 25, 2013 (5 pages).

English Translation of Japanese Unexamined Patent Publication No. H08 (1996)-34063 (9 pages).

Chen et al. article "Gray-scale photolithography using microfluidic photomasks" dated Feb. 18, 2003, PNAS, vol. 100, No. 5 pp. 1499-1504.

Lu et al. article "A digital micro-mirror device-based system for the micorfabrication of complex, spatially patterned tissue engineering scaffolds" published on-line Jan. 27, 2006 on Wiley Interscience (www.interscience.wiley.com), pp. 396-405.

Sun et al. article "Projection micro-stereolithography using digital micro-mirror dynamic mask" available on-line Mar. 16, 2005 at www.sciencedirect.com, pp. 113-120.

European Search Report for European Patent Application No. EP 06251473.2 dated Jan. 31, 2008 (4 pages).

European Search Report for European Patent Application No. EP 06251474.0 dated Jan. 31, 2008 (41 pages).

European Search Report for European Patent Application No. EP 07016909.9 dated Jan. 16, 2008 (4 pages).

English translation of DE 19957370.

English translation of EP 1192041.

English translation of EP 1849587.

English translation of FR 2692053.

English translation of WO 2005110722.

PCT International Search Report for International Application No. PCT/US2009/061159.

PCT Written Opinion of International Search Authority for International Application No. PCT/US2009/061159.

U.S. Appl. No. 12/203,177, filed Sep. 3, 2008.

IEIC Technical Report dated Sep. 2001 by K Takahaski entitled "A New Application of DMD to Photolithography and Rapid Prototyping System".

A Thesis dated Jun. 2008 by Jonathan Zyzalo, Masked Projection Stereolithography: Improvement of the Limaye Model for Curing Single Layer Medium Sized Parts (pp. i-xiii, 1-75).

A Thesis dated Jun. 2008 by Jonathan Zyzalo, "Masked Projection Stereolithography : Improvement of the Limaye Model for Curing Single Layer medium Sized Parts" (pp. 76-168).

A Thesis dated Jun. 2008 by Jonathan Zyzalo, "Masked Projection Stereolithography : Improvement of the Limaye Model for Curing Single Layer medium Sized Parts" (pp. 169-260).

* cited by examiner

EUV MASK AND METHOD FOR FORMING THE SAME

PRIORITY DATA

This application is a continuation application of U.S. application Ser. No. 13/328,166, filed Dec. 16, 2011, which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, the need to perform higher resolution lithography processes grows. One of the leading next-generation lithography techniques is an extreme ultraviolet (EUV) lithography. Others include X-Ray lithography, ion beam projection lithography, and electron-beam projection lithography.

EUV lithography employs scanners using light in the EUV region, having a wavelength of about 10-15 nm. Some EUV scanners provide 4× reduction projection printing, similar to some optical scanners, except that the scanners use reflective rather than refractive optics, (e.g., mirrors instead of lenses). EUV scanners provide the desired pattern on an absorption layer ("EUV" mask absorber) formed on a reflective mask. An absorption layer however may not fully absorb the incident radiation and a portion of the incident radiation is reflected through the absorption layer. This often results in an inadequate aerial image contrast, which may lead to poor pattern profiles and poor resolution, particularly as pattern features continue to decrease in size. It is desired to have improvements in this area.

SUMMARY

The present disclosure provides many different embodiments of an EUV mask that provide one or more improvements over the prior art. In one embodiment, an EUV mask includes a low thermal expansion material (LTEM) substrate and a reflective multilayer (ML) disposed on the LTEM substrate. A capping layer is disposed on the reflective ML and a patterned absorption layer disposed on the capping layer. The pattern includes an antireflection (ARC) type pattern.

In another embodiment, an EUV mask includes a LTEM substrate and a reflective multilayer (ML) of molybdenum-silicon (Mo/Si) disposed on the LTEM substrate. A ruthenium (Ru) capping layer is disposed on the ML and a patterned low reflectivity tantalum boron nitride (LR-TaBN) absorption layer is disposed on the Ru capping layer. The pattern defines a plurality of reflective regions and absorptive regions, and the pattern defines a plurality of ARC trenches in the absorptive region.

In yet another embodiment, an EUV mask includes a LTEM substrate with a conductive chromium nitride (CrN) layer coated at its bottom surface. A reflective multilayer (ML) of forty-pairs of molybdenum-silicon (Mo/Si) is disposed on the LTEM substrate and a ruthenium (Ru) capping layer is disposed on the ML. A patterned LR-TaBN absorption layer is disposed on the Ru capping layer. The pattern defines a plurality of reflective regions and absorptive regions. The pattern also has an ARC pattern in the absorptive region and a plurality of ARC trenches. The ARC trenches have a depth to produce destructive interference among reflected light rays from the absorptive regions, and display in various pattern in the absorptive regions in different mask areas.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
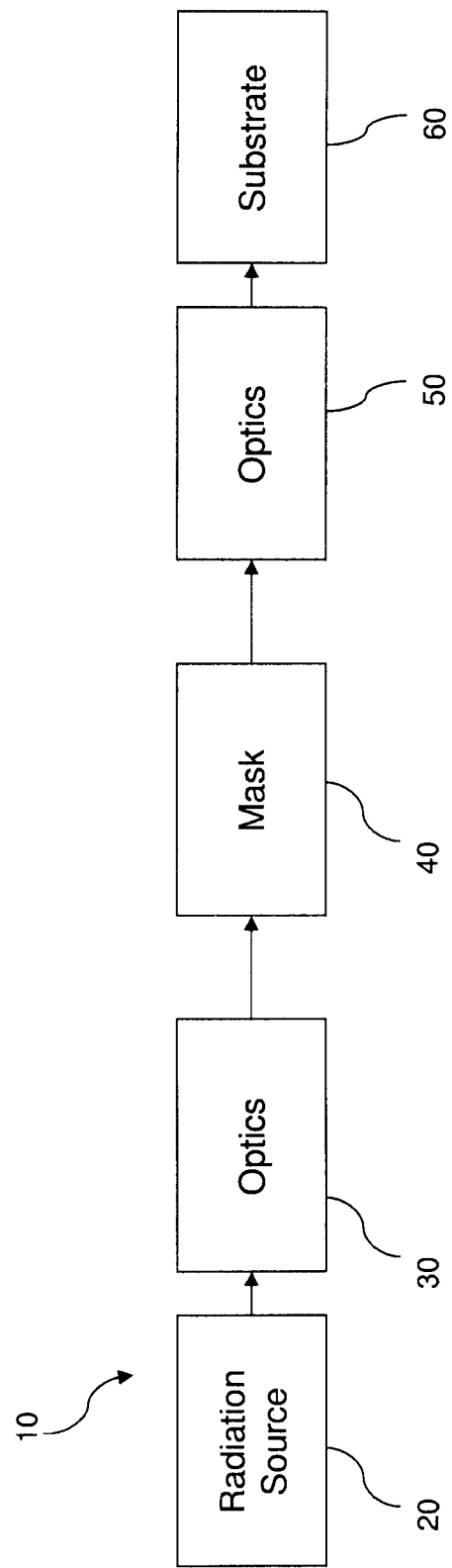
FIG. 1 is a block diagram of a lithography system for implementing one or more embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, an EUV lithography system 10 includes a radiation source 20, a plurality of illumination optics 30, a mask 40 (in the present disclosure, the terms of mask, photomask, and reticle are used to refer to the same item), a plurality of projection optics 50, and a target 60 such as a semiconductor wafer on a substrate stage. However, other configurations and inclusion or omission of devices may be possible. In the present embodiment, the radiation source 20 includes a source providing electromagnetic radiation having a wavelength in the EUV range. For example, the radiation source 20 provides EUV radiation having a wavelength of approximately 13.5 nm. The illumination optics 30 are configured to guide a radiation beam to the mask 40. The mask 40 is a reflective reticle such as described in further detail later below. The mask 40 may be positioned on a reticle chuck. The electromagnetic radiation reflected from the mask 40 (e.g., a patterned radiation beam) is collected by the projection optics 50. The projection optics 50 may be reflective and may include a magnification of less than one (thereby reducing the patterned image included in the radiation). The projection optics 50 direct the patterned radiation to the target 60 (e.g., a semiconductor wafer). The target 60 includes a photosensitive layer (e.g., photoresist or resist), which is sensitive to the EUV radiation. The target 60 may be held by a target substrate stage. The target substrate stage provides control of the target substrate position such that the image of the reticle is scanned onto the target substrate in a repetitive fashion (though other lithography methods are possible). The lithography system 10 or portion thereof may include a vacuum atmosphere.

The following description refers to the mask 40 and a mask fabrication process. The mask fabrication process includes two steps: a blank mask fabrication process and a mask patterning process. During the blank mask fabrication process, a blank mask is formed by depositing suitable layers (e.g., multiple reflective layers) on a suitable substrate. The blank mask is patterned during the mask fabrication process to have a design of a layer of an integrated circuit (IC) device (or chip). The patterned mask is then used to transfer circuit patterns (e.g., the design of a layer of an IC device) onto a semiconductor wafer. The pattern can be transferred over and over onto multiple wafers through various lithography processes. Several masks (for example, a set of 15 to 30 masks) may be used to construct a complete IC device.

Various masks are fabricated for being used in various processes. For example, an EUV mask in an EUV lithography processes can be used to print features with smaller critical dimensions (CD) than other conventional techniques. An unique set of challenges arises from masking and reflection of EUV radiation. For example, most condensed materials absorb at the EUV wavelength, so a reflective mask may be needed for EUV lithography processes.

Figure 2:
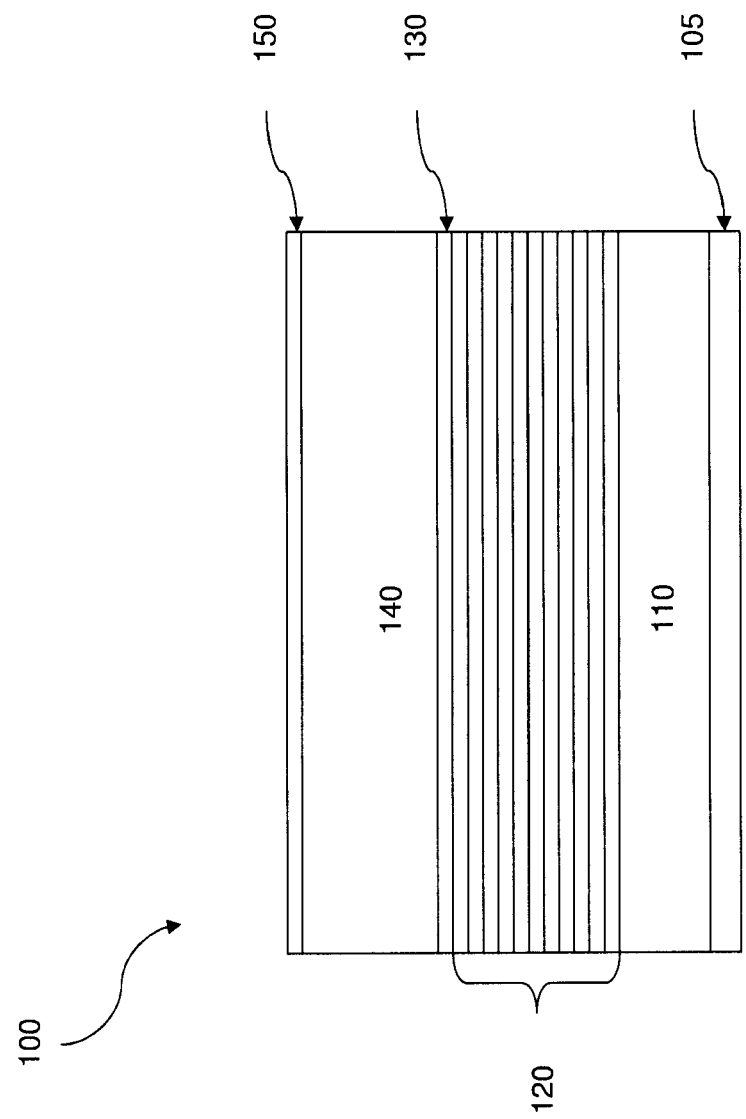
FIGS. 2-5 illustrate cross sectional views of various aspects of one embodiment of an EUV mask at various stages of a lithography process constructed according to aspects of the present disclosure.

Referring to FIG. 2, an EUV blank mask 100 comprises a low thermal expansion material (LTEM) substrate 110. The LTEM substrate 110 may include LTEM glass, quartz, silicon, silicon carbide, black diamond, and/or other low thermal expansion substances known in the art. The LTEM substrate 110 serves to minimize image distortion by mask heating. In the present embodiment, the LTEM substrate includes materials with a low defect level and a smooth surface. In addition, a conductive layer 105 may be deposited on the bottom surface of the LTEM substrate 110. The conductive layer 105 is operable to provide for electrostatically coupling the EUV blank mask 100 to a mask chuck. In an embodiment, the conductive layer 105 includes chromium nitride (CrN), though other compositions are possible.

A reflective multilayer (ML) 120 is disposed over the LTEM substrate 110. The reflective ML 120 includes a large number of alternating layers of materials having a high refractive index and a low refractive index. A material having a high refractive index has a tendency to scatter EUV light and on other hand, a material having a low refractive index has a tendency to transmit EUV light. Pairing these two type materials together provides a resonant reflectivity. The ML 120 includes a plurality of film pairs, such as molybdenum-silicon (Mo/Si) film pairs (e.g., a layer of molybdenum above or below a layer of silicon in each film pair). Alternatively the ML 120 may include molybdenum-beryllium (Mo/Be) film pairs, or any material that is highly reflective at EUV wavelengths can be utilized for the ML 120. The thickness of each layer of the ML 120 depends on the EUV wavelength and the incident angle. The thickness of the ML 120 is adjusted to achieve a maxim constructive interference of the EUV light reflected at each interface and a minimum absorption of the EUV light by the ML 120. The ML 120 may be selected such that it provides a high reflectivity to a selected radiation type/wavelength (e.g., reflectivity of 70%). A typical number of film pairs is 20-80, however any number of film pairs is possible. In an embodiment, the ML 120 includes forty pairs of layers of Mo/Si. Each Mo/Si film pair has a thickness of 5-7 nm, with a total thickness of 300 nm.

A capping layer 130 is formed on the ML 120 to prevent oxidation of the ML during a mask patterning process and an absorber layer repairing process. In addition, the capping layer 130 acts as an etch stop in an absorption layer patterning process. In the present embodiment, the capping layer 130 has different etch characteristics than the absorption layer. The capping layer 130 includes ruthenium (Ru) with a 20-80 nm thickness. Alternatively, the capping layer 130 may include silicon dioxide ($SiO_2$), amorphous carbon or other suitable compositions. A low temperature deposition process is often chosen for the capping layer to prevent interdiffusion of the ML 120.

An absorption layer 140 is formed on the capping layer 130. The absorption layer 140 preferably absorbs radiation in the EUV wavelength ranges projected onto the patterned EUV mask. The absorption layer 140 may include chromium, chromium oxide, titanium nitride, tantalum nitride, tantalum, titanium, or aluminum-copper. The absorption layer 140 may be formed of multiple layers. For example, the absorption layer 140 is formed by a dual-layer of chromium and tantalum nitride. In the depicted embodiment, the absorption layer 140 includes low reflectivity tantalum boron nitride (LR-TaBN). In a subsequent etching process, LR-TaBN shows a more anisotropically and a faster etch than chromium. LR-TaBN also shows adequate overetch tolerance, a controllable etch profile, and a negligible etch bias. The absorption layer 140 may be any suitable thickness for a given material to achieve an adequate absorption.

An antireflection (ARC) layer 150 is deposited above the absorption layer 140. The ARC layer 150 is configured to reduce a reflection of a lithographic radiation having a wavelength shorter than the deep ultraviolet (DUV) range from the absorption layer 140 for a DUV inspector. The ARC layer 150 may use compound materials such as TaBO, $Cr_2O_3$, ITO, $SiO_2$, SiN, $TaO_5$, or any suitable material.

Additionally or alternatively, in an embodiment, a buffer layer (not shown) is formed on the capping layer 130 as an etch stop layer for patterning the absorption layer 140 and a sacrificial layer during a subsequent focused ion beam (FIB) defect repair process for the absorption layer 140. The buffer layer may include silicon dioxide ($SiO_2$), silicon oxynitride (SiON) or other suitable materials.

One or more of the layers 105, 120, 130, 140 and 150 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, and/or other methods known in the art. In the present embodiment, the absorber layer 140 is deposited by a sputtering deposition technique to achieve an adequate thickness uniformity, with relatively low defects and good adhesion. The compositions and/or physical structures of one or more layers described above may be selected based upon reflectivity/absorption of the radiation to be used with the mask 100, the stress compatibility with adjacent layers, and/or other criteria known in the art.

Figure 3:
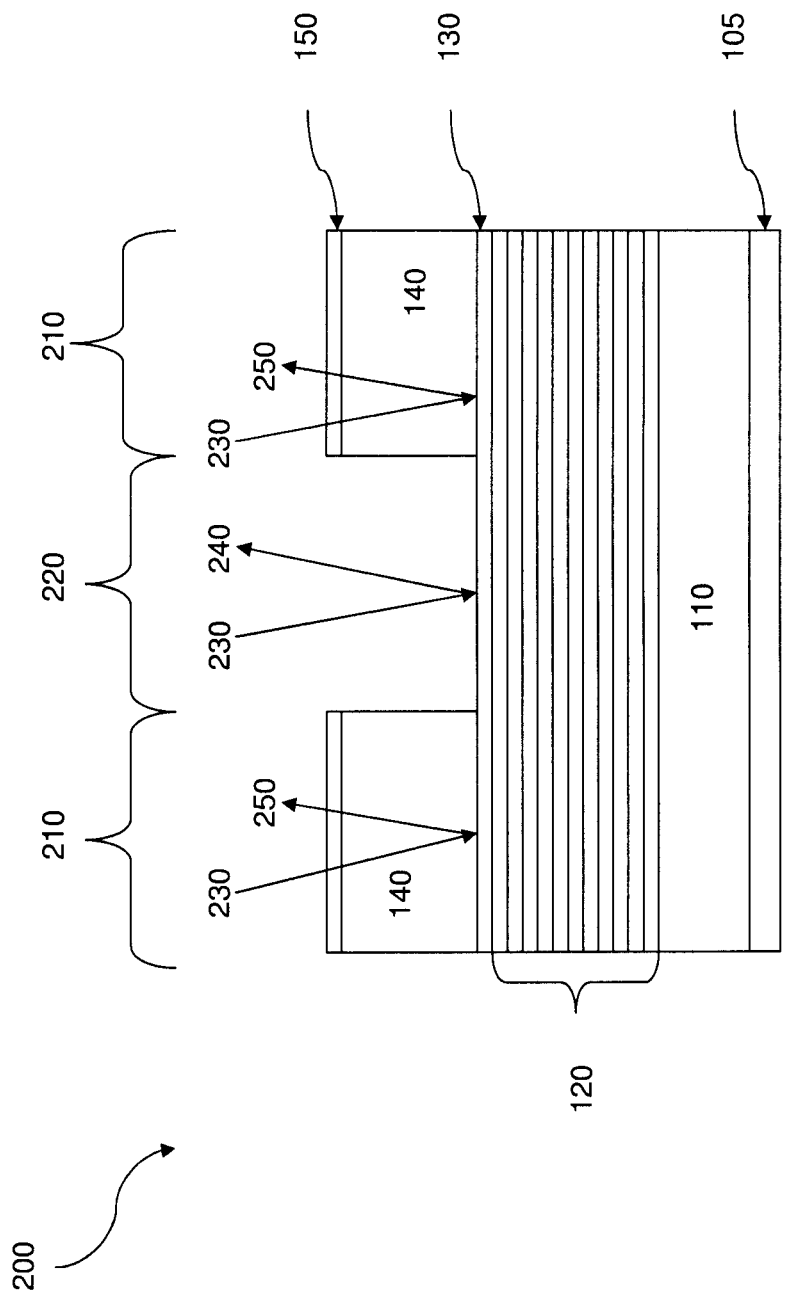

Referring to FIG. 3, in the present embodiment, the absorption layer 140 is patterned to form the design layout pattern mask 200 on the blank mask 100. The absorption layer 140 is patterned to define a plurality of specified absorptive regions, 210, where the absorption layer 140 remains, and a plurality of specified reflective regions, 220, where the absorption layer 140 is removed. An incident light ray 230 from an EUV lithographic light source (not shown) on the mask 200 is reflected mainly from the interfaces of the ML 120 below the absorption layer 140. The reflected light ray from the ML 120 in the reflective region 220 forms a reflected light ray 240. The reflected light ray 240 is a patterned beam, according to the pattern defined by the absorption layer 140. The reflected light ray 240 is collected and projected to a target substrate (e.g., a semiconductor wafer) through a projection optic system. In the meantime the incident light ray 230 may be reflected through the absorption layer 140 in the absorptive region 210 to form a reflected light ray 250. In some cases, the reflected light ray 250 is quite strong in intensity thus the absorptive region 210 may act as a reflective region of the EUV mask 200 rather than being an absorptive regions. Hence, the pattern projected onto the wafer (i.e., the pattern defined by the reflections from the EUV mask 200) may not be a desired pattern (i.e., the pattern as defined by the reflective regions 220 and the absorptive regions 210). The pattern projected onto the wafer may suffer from low aerial image contrast. Additionally, reflection light forms at a mask border will be a noise source and impact the wafer window.

Figure 4:
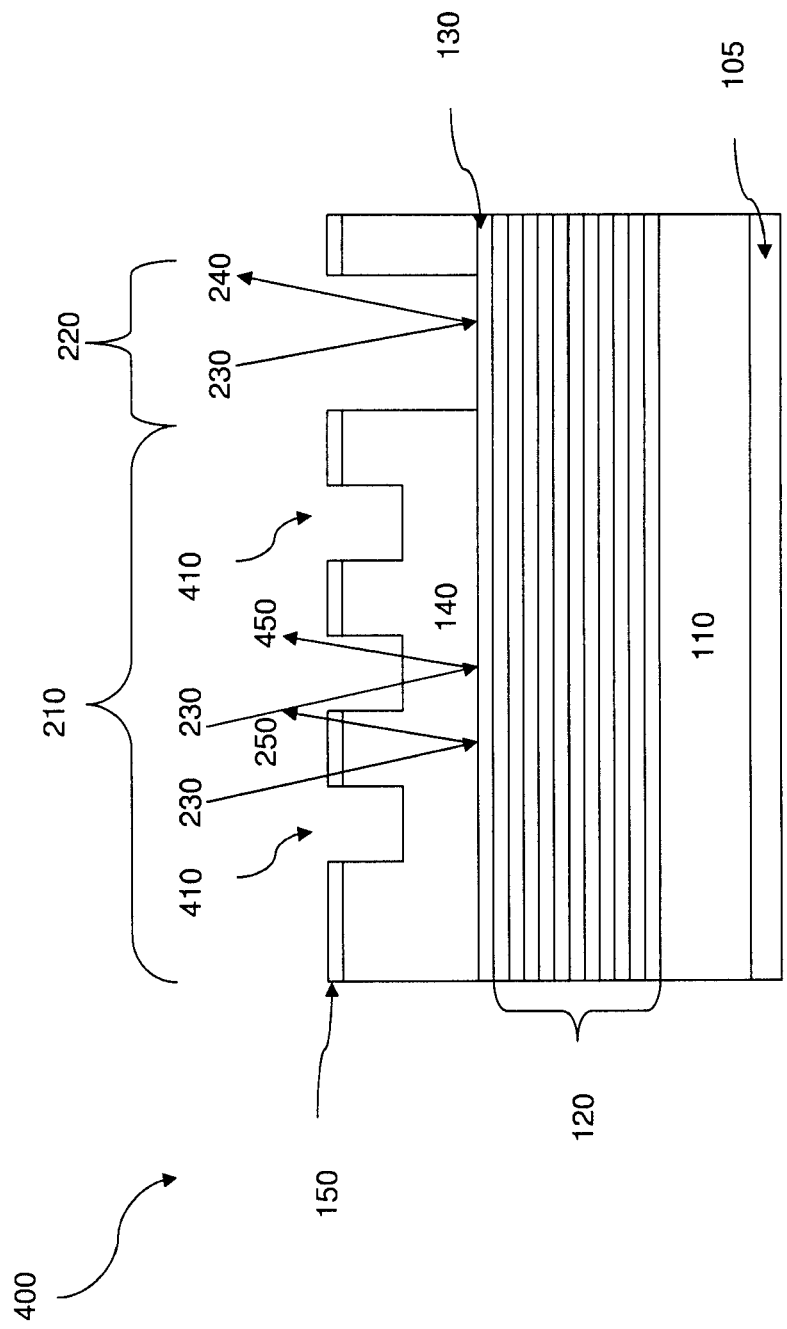

In order to reduce or eliminate such undesirable reflections from the absorptive region 210, an EUV mask 400 can be used instead of the EUV mask 200 discussed above. The difference between the EUV mask 400 and 200 is that an antireflection (ARC) pattern is added to the absorption layer 140 in the absorptive region 210, as shown in FIG. 4. The ARC-pattern includes a plurality of ARC trenches 410 being formed in the absorption layer 140 of the absorptive region 210. The reflected light ray 250 is the light ray, which is reflected from the ML 120 traveling through a full thickness of the absorption layer 140. Another reflected light ray 450 is a light ray, which is reflected from the ML 120 traveling through the trench (traveling through a portion of thickness of the absorption layer 140). The difference in the traveling length (e.g. the depth of the ARC trench 410) of reflected light rays 250 and 450 results a phase difference when they interfere with each other.

The depth of the ARC trench 410 is tuned to have a dimension such that a destructive interference is produced between the reflected light ray 250 and 450. With the chosen depth of the ARC trenches 410, reflected light rays 250 and 450 will be opposite in phase with respect to each other and cancel each other out by destructive interference. Hence, undesirable reflections from absorption layer 140 in the absorptive region 210 are reduced. Due to the periodic nature of destructive interference, various depths of the ARC trenches 410 can be chosen. The depths of the ARC trenches 410 can be chosen differently in different absorptive regions 210 of mask areas of the EUV mask 400. In the depicted embodiment, the depth of the ARC trenches 410 is about 40 nm formed in the LR-TaBN absorption layer 140.

Figure 5:
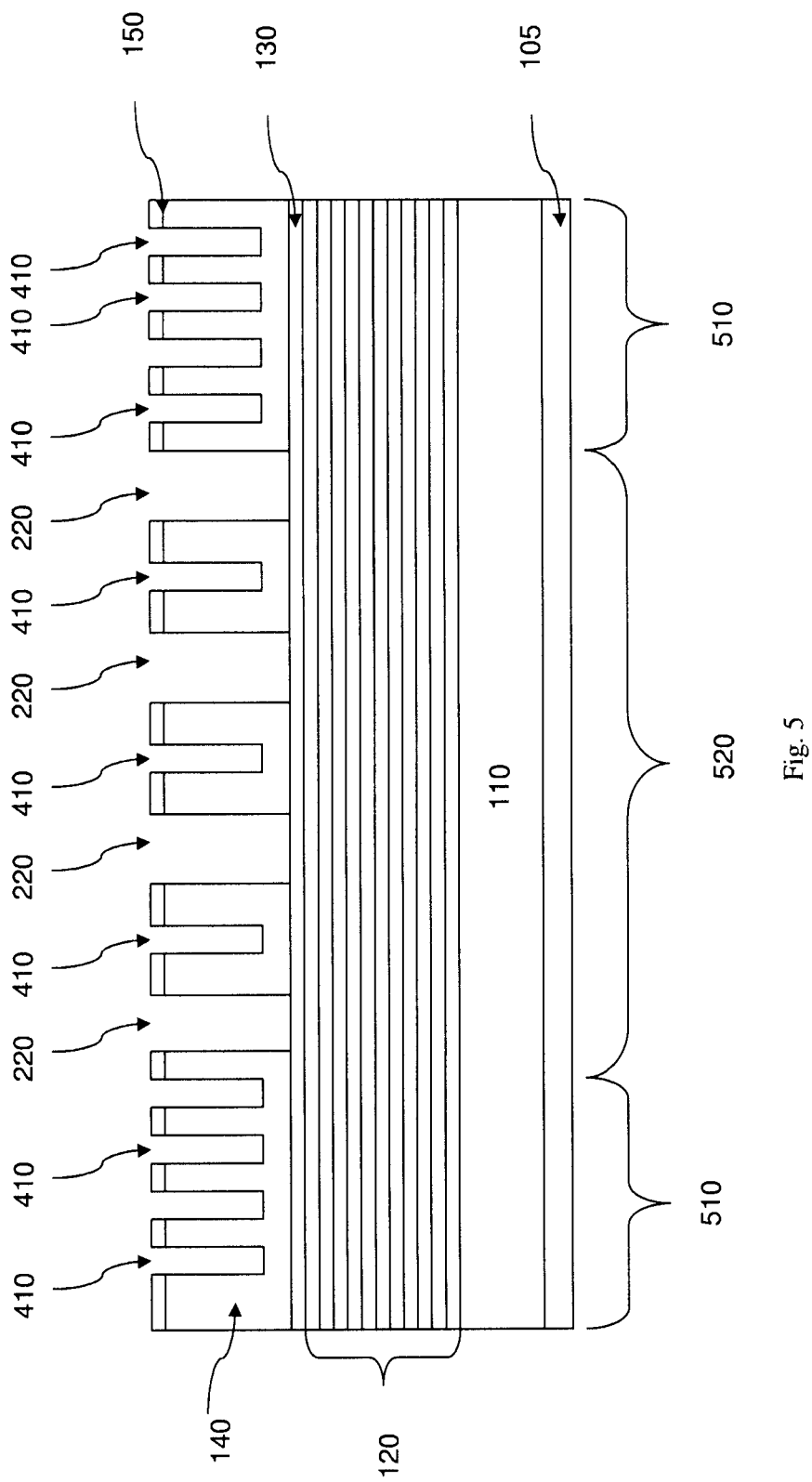

The ARC trenches 410 can be formed with various trench profiles, such as vertical, non-vertical, flat-bottom trench and non-flat-bottom trench. In the depicted embodiment, the ARC trenches 410 are formed in a vertical trench profile with a flat bottom. The ARC trenches 410 can be displayed in various ARC-patterns, such as a dense line pattern, dense hole pattern or other suitable patterns. Different ARC patterns (by ARC trenches 410) can be used in the absorptive regions 210 of different mask areas, such as in a mask border area 510 and in a mask main pattern area 520 (as shown in FIG. 5). The ARC trenches 410 and the reflective regions 220 can be formed together by a single patterning process or be formed separately by a multiple patterning processes. In the depicted embodiment, the ARC trenches 410 is formed with the reflective regions 220 together by a single patterning process.

A patterning process of the absorption layer 140 includes photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and/or ion-beam writing. An etching process is followed to selectively remove portions of the absorption layer 140 (and the capping layer 130) to uncover portions of the ML 120 on the LTEM substrate 110. The etching process may include dry etching, wet etching, and/or other etching methods. The absorption layer 140 etching process may not only be chosen to achieve a high resolution for EUV masks but also to have a tight and uniform distribution of the critical dimension (CD) over the EUV mask 400.

The EUV mask 400 may incorporate other resolution enhancement techniques such as an optical proximity correction (OPC). The EUV mask 400 may undergo a defect repair process by a repair system. The mask repair system is a suitable system, such as an e-beam repair system and/or a focused ion beam (FIB) repair system Based on the discussions above, it can be seen that the present disclosure offers the EUV mask 400 with an ARC-pattern to reduce the reflectance in the absorptive regions 210 without increasing the thickness of the absorption layer 140. It provides a better process window for an IC fabrication. The ARC-pattern reduces the reflectance in border areas 510, which simplify the EUV mask process by a single patterning process. The ARC-pattern filters out high order diffraction wave by the ARC trenches 410. The ARC-pattern improves aerial image contrast between the absorptive regions 210 and reflective region 220.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask comprising:
    a reflective multilayer over a substrate;
    an absorption layer disposed over the reflective multilayer; and
    an antireflection layer disposed over the absorption layer, wherein a trench extends through the antireflection layer and terminates in the absorption layer.

2. The mask of claim 1, wherein the absorption layer includes a tantalum boron nitride material.

3. The mask of claim 1, further comprising a capping layer disposed between the reflective multilayer and the absorption layer.

4. The mask of claim 3, wherein the capping layer includes a ruthenium material.

5. The mask of claim 1, further comprising another trench extending through the antireflection layer and into the absorption layer, wherein the trench has a first depth and the another trench has a second depth that is different than the first depth.

6. The mask of claim 1, further comprising a conductive layer, wherein the reflective multilayer is disposed over the conductive layer.

7. The mask of claim 1, further comprising a low thermal expansion material substrate, wherein the reflective multilayer is disposed over the low thermal expansion material substrate.

8. An extreme ultraviolet (EUV) mask comprising:
a low thermal expansion material (LTEM) substrate;
a reflective multilayer (ML) of molybdenum-silicon (Mo/Si) disposed on the LTEM substrate;
a ruthenium (Ru) capping layer disposed on the ML;
a patterned low reflectivity tantalum boron nitride (LR-TaBN) absorption layer disposed on the Ru capping layer, wherein the pattern defines a plurality of reflective regions and absorptive regions, and the pattern includes a plurality of ARC trenches in the absorptive region.

9. The EUV mask of claim 8, wherein the reflective ML comprises forth pairs of Mo/Si with each Mo/Si film pair being 5-7 nm thick.

10. The EUV mask of claim 8, wherein the ARC trenches having a depth being able to produce destructive interference among the reflected light rays from the absorptive regions.

11. The EUV mask of claim 8, wherein the ARC trenches are arranged in a dense hole pattern at a mask border area and a dense line pattern at a mask main pattern area.

12. The EUV mask of claim 8, wherein one of the ARC trenches extends into the LR-TaBN absorption layer towards the Ru capping layer such that a portion of the LR-TaBN absorption layer extends from a bottommost surface of the trench to a top surface of the Ru capping layer.

13. The EUV mask of claim 12, wherein another one of the ARC trenches extends into the LR-TaBN absorption layer to the Ru capping layer.

14. The EUV mask of claim 8, further comprising a conductive layer, wherein the reflective multilayer is disposed over the conductive layer.

15. The EUV mask of claim 8, further comprising an antireflection layer disposed over LR-TaBN absorption layer.

16. A method of forming a mask comprising:
forming a reflective multilayer over a substrate;
forming a capping layer over the reflective multilayer;
forming an absorption layer over the capping layer;
forming an antireflection layer over the absorption layer; and
removing a first portion of the antireflection layer and a first portion of the absorption layer to form a first trench extending through the antireflection layer that terminates in the absorption layer.

17. The method of claim 16, further comprising removing a second portion of the antireflection layer and a second portion of the absorption layer to form a second trench extending through the antireflection layer that terminates at the capping layer.

18. The method of claim 16, further comprising removing a second portion of the antireflection layer and a second portion of the absorption layer to form a second trench extending through the antireflection layer and into the absorption layer, wherein the first trench has a first depth and the second trench has a second depth that is different than the first depth.

19. The method of claim 16, wherein the capping layer includes a ruthenium material, and
wherein the absorption layer includes a tantalum boron nitride material.

20. The method of claim 16, wherein removing the first portion of the absorption layer includes performing an etching process.

* * * * *